United States Patent [19]
Cockerill et al.

[11] Patent Number: 5,976,905
[45] Date of Patent: *Nov. 2, 1999

[54] METHOD OF MANUFACTURING VCSEL ARRAYS USING VAPOR PHASE EPITAXY TO ACHIEVE UNIFORM DEVICE-TO-DEVICE OPERATING CHARACTERISTICS

[75] Inventors: Timothy M. Cockerill, Superior, Colo.; Robert P. Bryan, Albuquerque, N.Mex.

[73] Assignee: Cielo Communications, Inc., Broomfield, Colo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/602,609

[22] Filed: Feb. 16, 1996

[51] Int. Cl.$^6$ .............. H01L 29/06; H01L 39/22; H01L 29/40
[52] U.S. Cl. .................. 438/36; 438/47
[58] Field of Search ............... 438/32, 39, 31, 438/47, 36; 257/98; 372/96

[56] References Cited

U.S. PATENT DOCUMENTS

| | | |
|---|---|---|
| 3,471,324 | 10/1969 | Wilson et al. . |
| 4,461,008 | 7/1984 | Connolly et al. . |
| 4,523,318 | 6/1985 | Connolly et al. . |
| 4,803,690 | 2/1989 | Takiguchi et al. ............ 372/96 |
| 4,987,472 | 1/1991 | Endo et al. . |
| 5,016,252 | 5/1991 | Hamada et al. . |
| 5,314,838 | 5/1994 | Cho et al. . |
| 5,400,356 | 3/1995 | Bringans et al. . |
| 5,465,266 | 11/1995 | Bour et al. . |
| 5,482,891 | 1/1996 | Shieh et al. ..................... 438/39 |
| 5,663,592 | 9/1997 | Miyazawa et al. ............. 257/627 |

OTHER PUBLICATIONS

T. S. Kuan, T. F. Kuech, W.I. Wang, and E.L. Wilkie, "Long–Range Order in $Al_xGa_{1-x}$–As", Physical Review Letters, Jan. 21, 1985, vol. 54, No. 3; The American Physical Society.

Gerald B. Stringfellow, "Organometallic Vapor–Phase Epitaxy: Theory and Practice", Academic Press, Inc (London) Ltd., pp. 204–212, 1989.

*Primary Examiner*—Brian Dutton
*Attorney, Agent, or Firm*—Christie, Parker & Hale, LLP

[57] ABSTRACT

An array of infrared vertical cavity surface-emitting lasers (VCSELs) and method of manufacturing the same is disclosed which reduces device-to-device non-uniformity for VCSEL arrays manufactured using well-known vapor phase epitaxial processes. The method involves growing layers comprising a standard infrared VCSEL array using a vapor phase epitaxial process on a substrate which is mosoriented from the (100) plane in the {111}A direction by preferably between eight and twelve degrees or more.

7 Claims, 5 Drawing Sheets

METHOD OF MANUFACTURING VCSEL ARRAYS USING VAPOR PHASE EPITAXY TO ACHIEVE UNIFORM DEVICE-TO-DEVICE OPERATING CHARACTERISTICS

BACKGROUND OF THE INVENTION

1. Field of the Invention

The present invention relates to the manufacture of arrays of vertical cavity surface emitting lasers (VCSELs) emitting light in the infrared range, and more particularly to the manufacture of such VCSEL arrays using vapor phase epitaxial growth techniques such as Metal Organic Chemical Vapor Deposition (MOCVD), Metal Organic Vapor Phase Epitaxy (MOVPE), or the like.

2. Art Background

It is often advantageous to manufacture light-emitting semiconductor devices in the form of arrays. For example, light emitting devices such as light-emitting diodes (LEDs) and vertical cavity surface emitting lasers (VCSELs) can be manufactured in the form of arrays, wherein the devices are epitaxially grown on a single substrate, processed and auto-tested as a whole wafer. Such devices have numerous benefits over light-emitting devices which cannot be auto-tested as whole wafer, such as edge emitting lasers.

For VCSELs, it is critically important that they exhibit device-to-device uniformity in their operating characteristics. More specifically, it is critically important that the VCSELs in an array exhibit uniform light output characteristics at a fixed input current. Where VCSEL arrays are used in data communications settings, light output power for each laser in an array must not be permitted to exceed an eye-safety limit (ESL) but yet have sufficient output power to maintain a bit-error rate below a specified maximum. Thus, predictability of VCSEL operation is crucial. VCSEL operation will vary as a function of many variables, including temperature, age, threshold current, etc. To meet the requisite specifications of multichannel communications applications, therefore, each variable must be constrained within a budget of variability to meet the operating specifications of an application. The typical budget for device-to-device non-uniformity is in the range of one decibel as constant current arc temperature.

It is neither practical nor cost-effective to drive each VCSEL of an array with a different current to achieve uniform light output power. Techniques similar to those used to maintain constant output power from edge emitters have been adapted for application to VCSEL arrays. For edge emitters, a back facet photodetector is integrated with the edge emitter to sense light which is being emitted from the back facet of the edge emitter. This photodetector creates an electrical control signal which is sensed to provide feedback control to the current level driving the edge emitter. While feedback control circuits have been invented to control the fluctuation of output power of arrayed VCSELs due to changes in substrate temperature (see U.S. application Ser. No. 08/302,313), such schemes add significantly to the cost of the VCSEL arrays. Moreover, these techniques do not compensate for variation in the electrical characteristics of each VCSEL over the array. The use of feedback control to eliminate variations in electrical uniformity would require a photodetector and feedback circuit for each individual VCSEL in the array. The added cost for such a scheme would be prohibitive.

Thus, from a cost perspective it is most desirable to drive each VCSEL of an array with the same drive current, and it is desirable that the light output power of each of the individual VCSELs be virtually identical as a function of the drive current. We have discovered that VCSEL arrays, designed to emit radiation in the infrared portion of the spectrum, and manufactured using vapor phase epitaxial growth techniques such as metal organic vapor phase epitaxy (MOVPE) or metal organic chemical vapor deposition (MOCVD) exhibit device-to-device array uniformity which is inferior to the uniformity which is achieved when such VCSEL arrays are manufactured using a molecular-beam epitaxy (MBE) process.

FIG. 1 illustrates the light output power and voltage versus drive current (LIV) characteristics of each of five VCSELs forming part of an eight-VCSEL array manufactured using MBE. FIG. 2 illustrates the LIV characteristics for each of five VCSELs which have been manufactured using an MOCVD process. It can be seen from these two figures that the light output power versus drive current characteristics of the VCSELs manufactured using the MBE process are fairly uniform. The light output power versus drive current characteristics of the VCSELs manufactured using the MOCVD process are quite non-uniform. Indeed, the light output power for the VCSELs manufactured using the MOCVD techniques exhibits a maximum output power differential of two milliwatts of output power at 21 milli-amps of drive current. This wide variation of output characteristics between VCSELs in the same array can prove unacceptable for typical data communications applications.

Nevertheless, it is highly desirable to manufacture VCSEL arrays using the vapor phase epitaxial processes. The cost of manufacturing VCSEL arrays using MOCVD and MOVPE machines is considerably less than the cost associated with manufacturing VCSEL arrays using an MBE machine. MOCVD and MOVPE systems typically have higher throughput, shorter growth time, and a maximum down time of only about one day. Changing sources is generally much easier because there is no vacuum which must be vented during replacement. MBE machines, on the other hand, involve a high-vacuum system through which the atoms are introduced as beams transmitted to the wafers. If a failure occurs within the high-vacuum chamber, the entire system must be brought down, vented to atmosphere, the sources replaced, and a bakeout procedure must be performed at a temperature of about 200° C. which takes as long as five days. Thus the down-time for an MBE system is typically on the order of one week. Moreover, the cost of MBE machines, particularly those which have higher wafer throughput and which employ load blocks for source replacement are far more costly than MOCVD and MOVPE type machines. For these reasons, MOCVD and MOVPE systems make up the bulk of the installed base of epitaxial machines in the industry.

Thus, it is highly desirable from a cost standpoint to find a solution to the high degree of array non-uniformity associated with the manufacture of semiconductor devices, particularly VCSELs, using MOCVD and MOVPE growth techniques.

It is known in the art that if light emitting devices are built using epitaxial growth techniques such as MBE, MOCVD, MOVPE, etc. on a substrate surface which is tilted to some degree with respect to the (100) crystallographic plane, that certain benefits can be derived. For example, U.S. Pat. No. 4,987,472 to Endo et al. discloses a method of manufacturing red and green LEDs by growing layers which form the LEDs on a substrate surface with an angle of inclination in the range of eight degrees to twelve degrees. The benefit derived from tilting the substrate surface is the elimination of surface defects which leads to higher light intensity from each of the LEDs produced on such a wafer.

In U.S. Pat. No. 5,016,252 to Hamada et al., a VCSEL device is disclosed for producing visible red light which is grown on a substrate surface having an angle of between five and seven degrees in the direction of the (011) plane. Again the purpose of the misorientation of the substrate is to reduce defect densities thereby decrease the threshold current for the VCSEL.

In U.S. Pat. No. 5,314,838 to Cho et al., a VCSEL for emitting infrared light is disclosed having a substrate misoriented by between one and seven degrees in the {111}A direction. The purpose of this misorientation is to grow distributed Bragg reflectors with improved reflectivity due to the elimination of roughness between the layers.

In the publication by G. B. Stringfellow et al., *J. Electronic Materials*, Volume 1, page 437 (1972), he discloses a phenomenon first experienced in building red edge emitting lasers because it is unique to the materials employed to emit red light. Red lasers typically employ GaInP/AlGaInP material systems. Stringfellow, et al. discloses that the Ga and In atoms tended to order themselves during epitaxial crystal growth such that In atoms will order themselves entirely in one plane while the Ga atoms order themselves entirely in another plane. A simple representation of this phenomenon is shown in FIG. 3. Instead of a distribution of In atoms mixed with Ga atoms to produce the desired alloy ratio, the In atoms are entirely separate in one plane 30 while the Ga atoms reside entirely in another plane 32, a layer 34 of atoms is sandwiched there between.

This long-range ordering problem tended to increase threshold current for the edge emitter and also its power consumption. Once the long-range ordering was identified using standard characterization techniques such as transmission electron microscopy (TEM), a solution to the problem was proposed to misorient the substrate. The misorientation of the substrate tends to create atomic steps of the lattice shown in FIG. 4. The more misoriented the substrate, the greater the number of atomic steps on the surface. Thus, when the edge emitter was grown on the misoriented substrate, although the Ga and In atoms still tended to order themselves along the steps, the existence of the steps increased the potential number of locations for the Ga and In atoms to be incorporated. This resulted in a more random distribution of the alloy atoms which led to lower power consumption and lower threshold currents. The long-range ordering effects in the InGaP material system were easily seen using known techniques for evaluating crystal growth. Moreover, the problem was reflected in the operating characteristics of the edge emitting laser despite its tendency to average out the effects of shorter-range variations in crystal composition because of the extensiveness of the ordering along the length of the edge emitting device.

When people began manufacturing VCSELs using the same red light material systems, they naturally continued to use misoriented substrates in the range of fifteen degrees (common misorientation of substrates needed to eliminate ordering in red edge—emitting lasers) because they were already familiar with the fact that this ordering phenomenon occurred in edge emitting devices and thus there was no reason not to continue to use the misoriented substrate for producing red VCSELs. With respect to VCSELs using GaAs and AlGaAs materials for emitting infrared radiation, no such long term ordering occurs and thus there has been no motivation to greatly misorient the substrate of infrared VCSELs. Moreover, it is only recently that VCSELs have been manufactured in the form of arrays, for which device-to-device uniformity has become a critical issue.

SUMMARY OF THE INVENTION

We have discovered that when infrared VCSEL arrays are manufactured using known vapor phase epitaxial growth processes such as MOCVD and MOVPE, when the surface of the GaAs substrate is tilted in a range of preferably between about eight and twelve degrees, the device-to-device non-uniformity of the output operating characteristics normally associated with such VCSEL arrays is reduced to the extent necessary for ensuring that each of the VCSELs of the array, when driven with the same input current, will fall within a range necessary for the VCSELs to meet the mandated ESL and minimum output power specifications for high-speed multichannel data communications applications. Thus, where we have previously manufactured infrared VCSEL arrays using vapor phase epitaxial growth techniques without the ten degrees of misorientation of the substrate, we experienced a 0% yield of such arrays capable of meeting the specifications requisite to their implementation in targeted data communications applications. By using the ten degrees of misorientation of the substrate, however, the yield improved to beyond 50%.

Broadly stated, the present invention is a method of manufacturing infrared VCSEL arrays using standard vapor phase epitaxial growth processes of conventional temperatures, wherein the GaAs substrate is misoriented from a (100) surface in a {111}A direction to the extent necessary to eliminate device-to-device non-uniformity of output characteristics to ensure that each of the devices of the array, when driven by the same input current, will meet the budgeted range (about one decibel at constant current arc temperature) requisite for the VCSELs of the array to meet ESL and minimum output power specifications for multichannel data communications applications.

Particularly, the invention is directed to a method of manufacturing an array of VCSELs wherein the non-uniformity of LIV operating characteristics caused by short-range ordering effects resulting from the complex chemistry of vapor phase epitaxial processes can be minimized such that the proper distribution of Al and Ga atoms to achieve the desired alloy composition $Al_x Ga_{(1-x)}$ in a substantially uniform manner over the entire array.

The invention is further directed to an array of infrared VCSELs manufactured using a conventional manufacturing technique including vapor phase epitaxial growth processes such as MOCVD and MOVPE, except that the growth surface of the GaAs substrate is misoriented in the {111}A direction from the (100) plane in an amount from between five degrees and fifteen degrees or more, and preferably between eight and twelve degrees to minimize the impact of short-range ordering on device-to-device non-uniformity.

DETAILED DESCRIPTION OF THE INVENTION

The manufacture of VCSELs for emission of infrared radiation using GaAs and AlGaAs materials is well known in the art. Such devices are typically made on an undoped GaAs substrate upon which a multilayer DBR mirror is grown using known epitaxial growth techniques. The DBR is typically comprised of semiconductor layers having alternating indices of refraction. They are typically alternating layers of $Al_x Ga_{(1-x)}$ As and AlAs, wherein the subscripts define the percentages of Al and Ga in the alloy. The first DBR is doped to produce n-type conductivity.

On top of the first DBR, a first cladding layer is then grown. An active region is then grown on top of the first cladding layer. A second cladding layer is then grown on top of the active region. The cladding layers are typically comprised of AlGaAs and are undoped. The active region is also undoped and contains one or more quantum well layers, separated from one another by barrier layers of the same basic composition as the cladding layers. The quantum wells are typically undoped GaAs. The cladding layers will often have grade percentages of alloy compositions.

On top of the second cladding layer is then grown a second DBR comprising alternating semiconductor layers of the same basic composition and indices of retraction as the first DBR. The semiconductor layers of the second DBR are doped to provide p-type conductivity.

An array of VCSELs can then be defined by simply implanting protons in the form of an annular isolation region which confines current flow within the individual VCSEL devices, while also electrically isolating each device from the other VCSEL devices in the array. The aperture of each of the devices is defined by an annular anode contact to the top mirror, and they can typically be about 250 microns apart.

We hypothesized, based on the typically accepted growth model for both MBE and vapor deposition epitaxial techniques, that due to the more complex chemistry going on at the surface of the crystal during vapor phase epitaxial processes that some short-range ordering of alloy atoms was occuring which, although not detectable using commonly employed techniques for profiling crystals, was significant enough to cause variation in the output characteristics of the VCSELs in the array from device-to-device. The effects of short-range ordering will be more manifest in circumstances when the VCSELs are arrayed, because a separation of only 250 microns would not be sufficient to average out the variations in alloy composition between the devices. Because edge-emitters are singular devices having a longitudinal dimension which is several times the separation between arrayed VCSELs, such short-range ordering will tend to average out and be masked. Moreover, device-to-device uniformity is not as critical an issue for devices which are manufactured as arrays.

Figure 5:
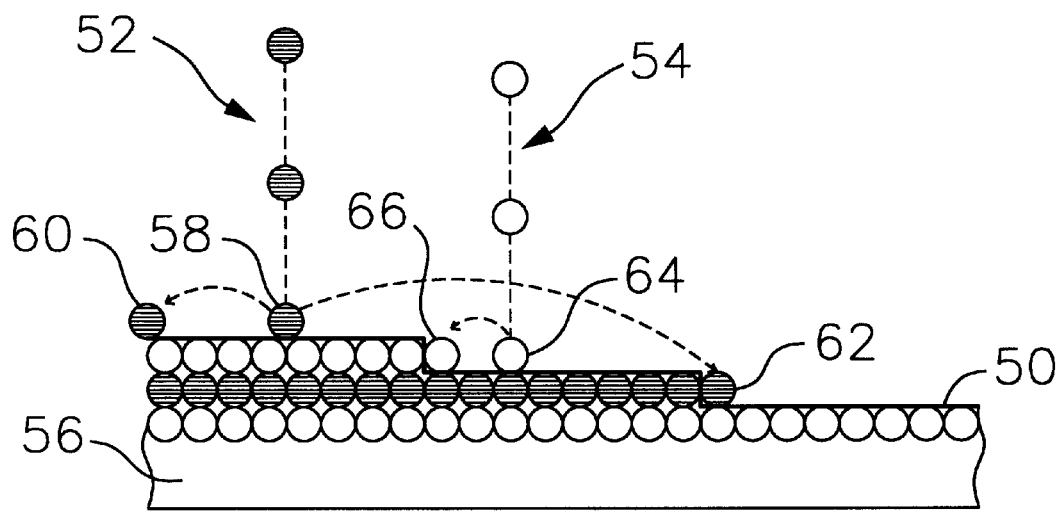
FIG. 5 is a cross-sectional representation of a commonly accepted conventional growth model for crystal growth using MBE on a substrate having relatively little misorientation from the (100) plane.

FIG. 5 illustrates the commonly accepted growth model for the MBE process. FIG. 5 represents a substrate having slight misorientation of its surface (i.e. two degrees), causing atomic steps 50. Beam 52 provides a source for As atoms and beam 54 represents the source for Ga and/or Al atoms. Due to the heating of substrate 56 (to about 600° C.), the atoms on the surface of substrate 56 have a great deal of kinetic energy. When atoms hit the surface they are capable of migrating to a location on the steps which is most energetically favorable to their incorporation into the forming lattice. Thus, when As atom 58 impinges on the substrate surface, it will either migrate to location 60 or perhaps location 62 in the forming lattice. Likewise, impinging Ga or Al atom 64 will likely migrate to position 66. Because the beams which act as the sources for the atoms are pure, the chemistry at the surface of the crystal is fairly simple and the ratio of alloy atoms can be fairly precisely controlled. Thus, it is likely that the alloy atoms will be distributed over the surface of the wafer in a ratio which closely tracks the desired ratio specified by $Al_x Ga_{(1-x)}$.

Figure 6:
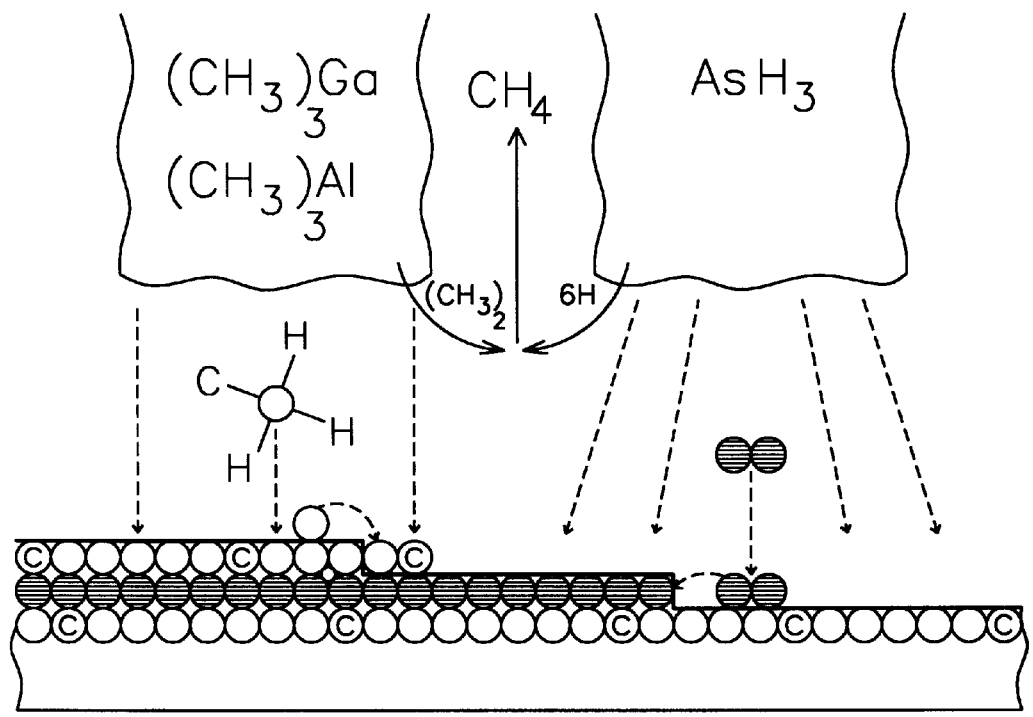
FIG. 6 is a cross-sectional representation of a commonly accepted conventional growth model for crystal growth using vapor phase epitaxial growth (e.g. MOCVD, MOVPE etc.) on a substrate having relatively little misorientation from the (100) plane.

FIG. 6 represents the accepted growth model for vapor phase epitaxial processes such as MOCVD and MOVPE. The sources for the atoms forming the crystal are gases. The Ga atoms are sourced in the form of trimethylgallium. Likewise, Al atoms are sourced in the form of trimethylaluminum. Finally, As atoms are supplied as arsene gas. Thus, the chemistry at the surface of the crystal lattice is considerably more complex because the Ga, Al, and As atoms must lose their carbon and hydrogen atoms through pyrolysis. In order to accomplish this, the substrate temperature is considerably higher for vapor phase techniques, typically in the neighborhood of 800° C., versus 600° C. or less for MBE. Moreover, some carbon atoms get incorporated into the lattice and even some hydrogen atoms may be found in the crystal lattice. The complexity of this chemistry overall makes it difficult for the Ga and Al atoms to move to locations randomly to ensure a uniform alloy mix. Thus, it is hypothesized that over short ranges of the crystal lattice, non-uniform distributions of the alloy atoms may occur which are significant enough to cause unacceptable variation in device-to-device operating characteristics over the VCSEL array.

Figure 1:
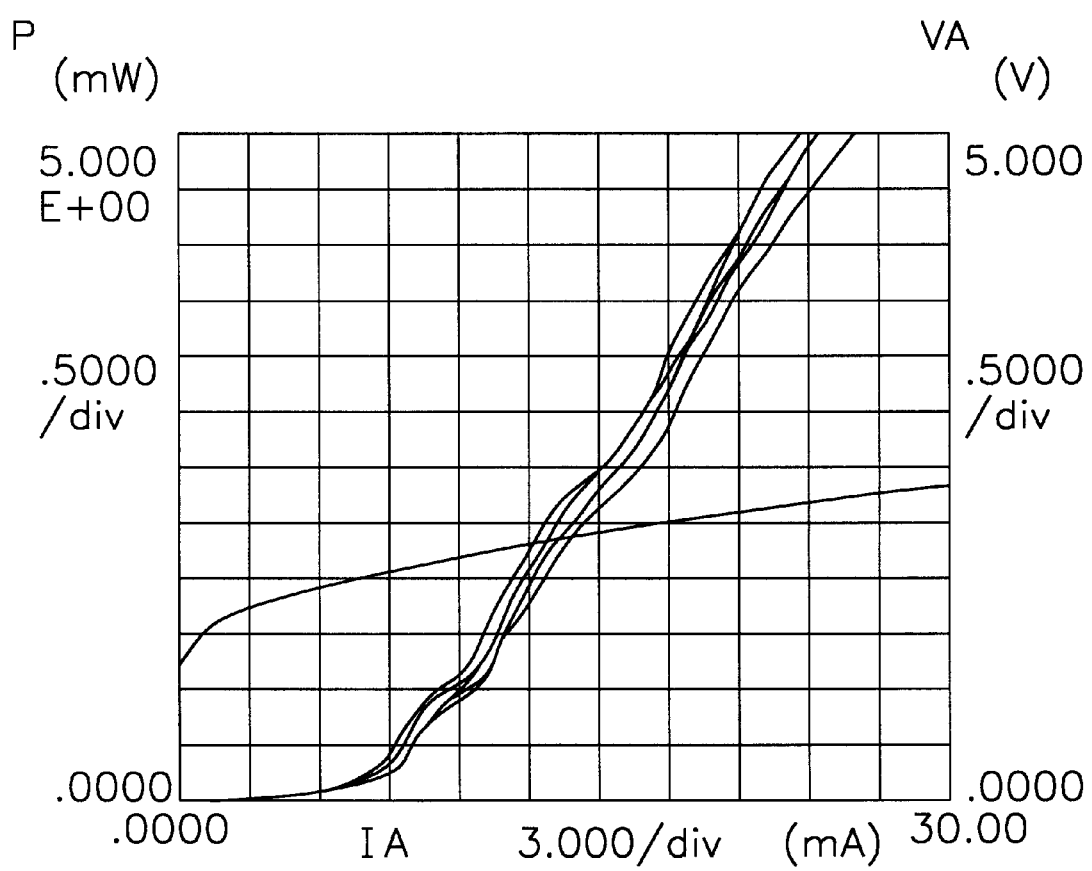
FIG. 1 is a conventional plot of light output power and voltage vs. input current for five infrared VCSELs of an eight VCSEL array manufactured on a substrate having a two degree misorientation of its growth surface from the (110) plane in the {111}A direction, the array being grown using well-known molecular-beam epitaxy (MBE).
Figure 2:
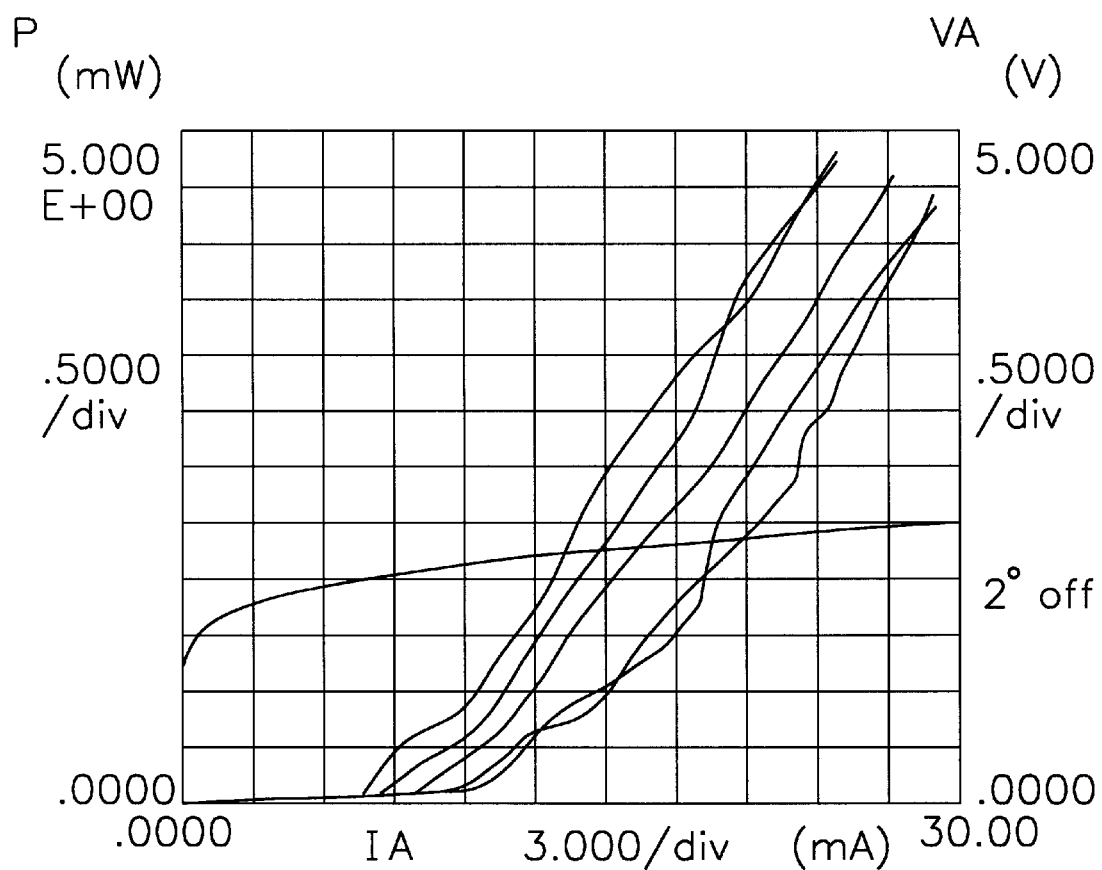
FIG. 2 is a conventional plot of light output power and voltage vs. input current for five infrared VCSELs of an eight VCSEL array manufactured on a substrate having a two degree misorientation of its growth surface from the (110) plane in the {111}A direction, the array being grown using a well-known vapor phase epitaxial growth process.
Figure 3:
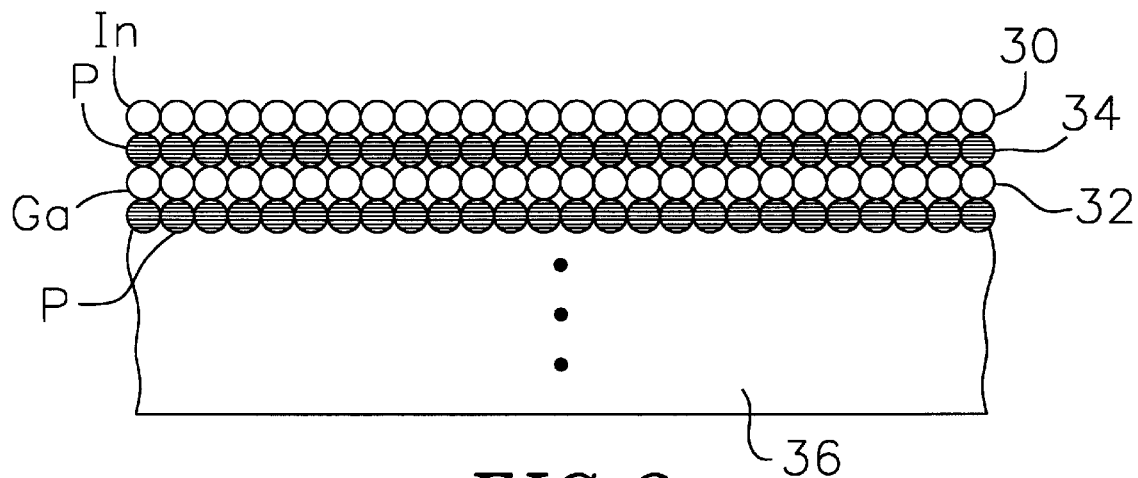
FIG. 3 is a cross-sectional representation of a well-known sub-lattice ordering phenomenon characteristic of a crystal made up of a GaInP/AlGaInP material system and grown on a relatively flat substrate using either MBE or vapor phase epitaxy.
Figure 4:
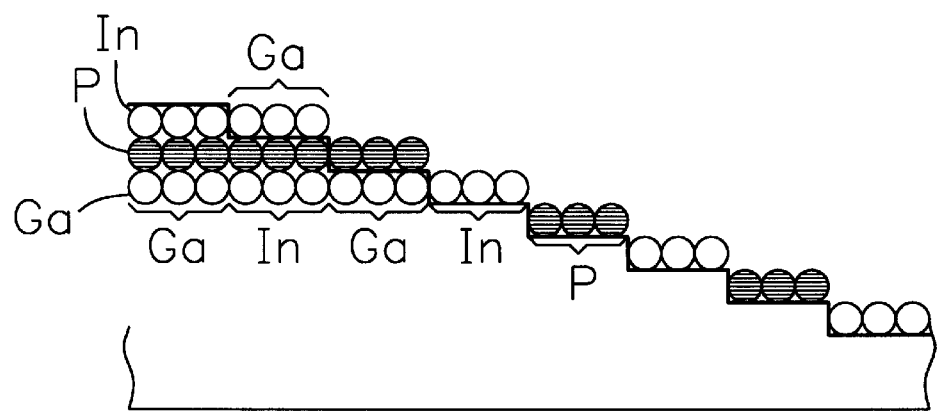
FIG. 4 is a cross-sectional representation of the effect of growing the conventional crystal of FIG. 3 on a substrate having a significant degree of misorientation.
Figure 7:
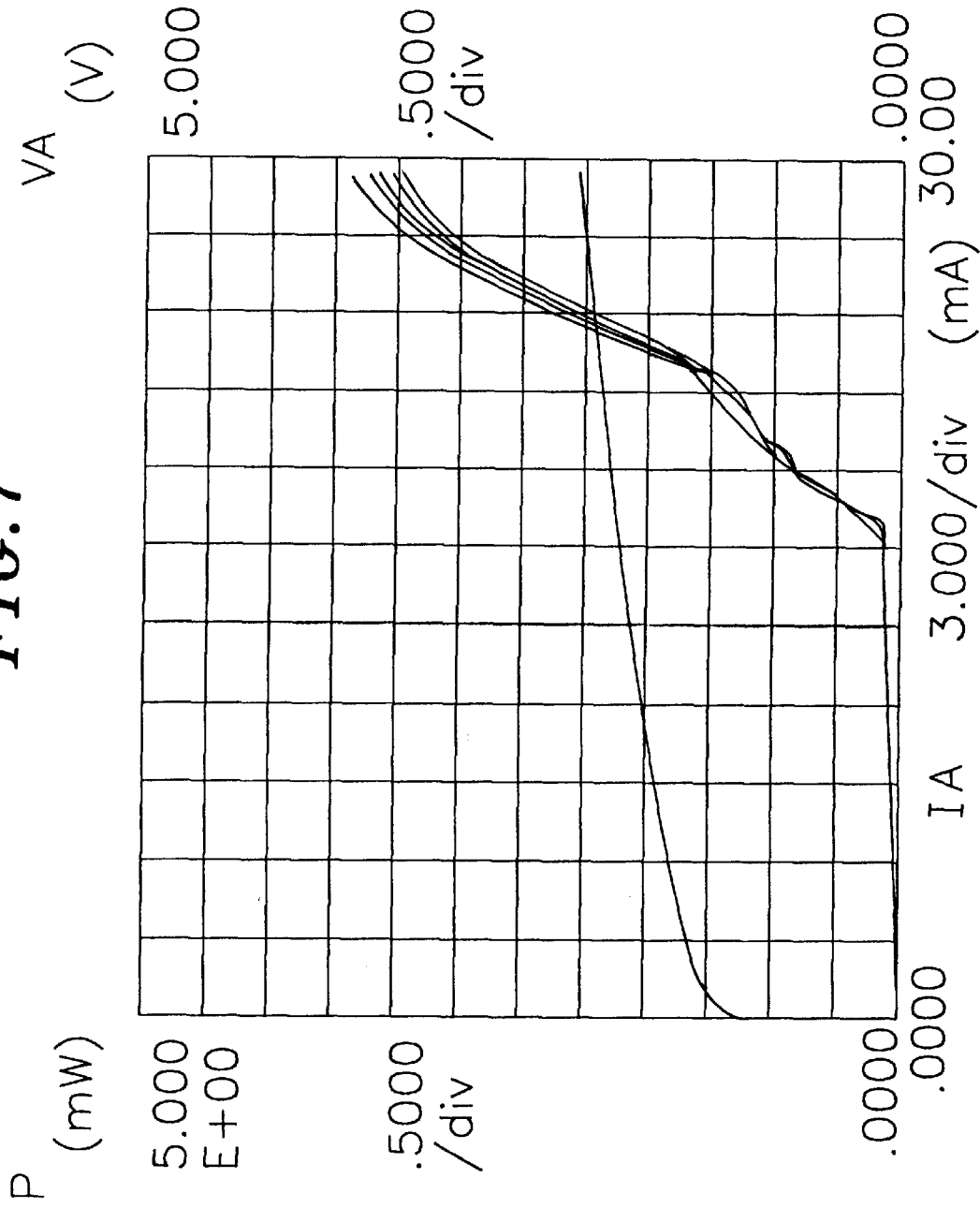
FIG. 7 is a plot of light output power and voltage vs. input current for five infrared VCSELs of an eight VCSEL array manufactured on a substrate having about a ten degree misorientation of its growth surface from the (110) plane in the {111}A direction, the array being grown using a well-known vapor phase epitaxial growth process.

Based on this hypothesis, we misoriented the substrate of an array of VCSELs and then manufactured them substantially in accordance with the discussion above. The only required change in the standard process was that the amount of p-type dopant (carbon) used to create p-type conductivity in the second mirror had to be increased by about three times the standard doping concentration to achieve operating characteristices which were in the range of those seen with a substrate misorientation of about 2 degrees. FIG. 7 illustrates the operating characteristics of five of the VCSELs of an 8-VCSEL array having been processed with a substrate having about ten degrees of misorientation, and it can be seen that the uniformity of operating characteristics has rivaled and perhaps exceeded uniformity provided by the MBE processed devices, the output characteristics of which are illustrated in FIG. 1. The yield of VCSEL arrays which met the requisite uniformity of the targeted data communications application were 0% for the arrays produced using MOCVD growth techniques and a 2 degree misorientation. The yield for the arrays manufactured using MOCVD growth techniques and which employed the 10 degree misorientation exceeded 50%.

Improved uniformity can be achieved with as little as five degrees of substrate misorientation, but maximum uniformity is achieved in a range of between about eight degrees and fifteen degrees of substrate misorientation.

What is claimed is:

1. A method of manufacturing VCSELs for emitting radiation having a wavelength within the range of 700 to 1100 nanometers, said method using vapor phase epitaxy and comprising the following steps:

growing a first DBR mirror on a GaAs substrate, the substrate being misoriented by at least about five degrees from a (100) plane in a {111}A direction;

growing a first cladding layer on the first DBR mirror;

growing an active region on the first cladding layer, the active region including at least one GaAs quantum well;

growing a second cladding layer on the active region;

growing a second DBR mirror on the second cladding layer; and implanting an annular isolation region in the second DBR mirror of each VCSEL.

2. The method of claim 1 wherein said substrate is misoriented in a range of about five and ten degrees from a (100) plane in a {111}A direction.

3. The method of claim 1 wherein said substrate is misoriented by at least ten degrees from a (100) plane in a {111}A direction.

4. A method of manufacturing an array of VCSELs for emitting radiation having a wavelength within the range of 700 to 1100 nanometers, said method comprising the steps of:

growing a first DBR mirror on a GaAs substrate;

growing a first cladding layer on the first DBR mirror;

growing an active region on the first cladding layer, the active region comprising at least one GaAs quantum well;

growing a second cladding layer on the active region;

implanting an annular isolation region for each VCSEL of the array;

wherein each of said growing steps of said method is performed using a vapor phase epitaxial process; and wherein said substrate is misoriented by about seven degrees from a (100) plane in a {111}A direction.

5. The method of claim 4, wherein said substrate is misoriented by between about seven and ten degrees from a (100) plane in a {111}A direction.

6. The method of claim 4 wherein said substrate is misoriented by at least ten degrees from a (100) plane in a {111}A direction.

7. A method of manufacturing a plurality of VCSELs having substantially uniform operating characteristics using a vapor phase epitaxial process, the method comprising:

growing a first DBR mirror on a substrate, the substrate being misoriented by at least about five degrees from a (100) plane in a substantially {111} direction;

growing a first cladding layer on the first DBR mirror;

growing an active region on the first cladding layer;

growing a second cladding layer on the active region;

growing a second DBR mirror on the second cladding layer; and isolating the second DBR mirror of each VCSEL with an annular isolation region, wherein semiconductor alloy deposited on the substrate to form the VCSEL has a substantially homogeneous composition.

* * * * *